United States Patent [19]

Antypas

[11] B 3,982,261
[45] Sept. 21, 1976

[54] EPITAXIAL INDIUM-GALLIUM-ARSENIDE PHOSPHIDE LAYER ON LATTICE-MATCHED INDIUM-PHOSPHIDE SUBSTRATE AND DEVICES

[75] Inventor: George A. Antypas, Palo Alto, Calif.

[73] Assignee: Varian Associates, Palo Alto, Calif.

[22] Filed: Aug. 12, 1974

[21] Appl. No.: 496,487

[44] Published under the second Trial Voluntary Protest Program on January 20, 1976 as document No. B 496,487.

Related U.S. Application Data

[63] Continuation of Ser. No. 291,457, Sept. 22, 1972, abandoned.

[52] U.S. Cl. .................... 357/16; 148/175; 313/94; 313/373; 331/94.5 H; 357/18; 357/30; 357/61

[51] Int. Cl.² ............... H01L 29/205; H01L 31/00; H01S 31/19

[58] Field of Search ........... 357/16, 17, 18, 30, 357/61

[56] References Cited
UNITED STATES PATENTS

| | | | |
|---|---|---|---|
| 3,218,205 | 11/1965 | Ruehrwein | 148/175 |
| 3,309,553 | 3/1967 | Kroemer | 357/16 |
| 3,415,989 | 12/1968 | Leventhal et al. | 357/30 |
| 3,614,549 | 10/1971 | Lorenz et al. | 357/16 |
| 3,644,770 | 2/1972 | Bell | 313/94 |
| 3,672,992 | 6/1972 | Schaefer | 357/30 |
| 3,691,476 | 10/1972 | Hayashi | 357/18 |
| 3,801,509 | 4/1974 | Kurata et al. | 357/61 |
| 3,814,996 | 6/1974 | Enstrom et al. | 357/16 |
| 3,821,777 | 6/1974 | James | 357/30 |

OTHER PUBLICATIONS

Burnham et al., "$Al_xGa_{1-x}As_{1-y}$, $Py'$-$GaAs_{1-y}Py$ Heterostructure Laser . . . ", Appl. Phys. Lett. 17, pp. 455–457 (11–70).

Shih et al., IBM Tech. Discl. Bull., Vol. 11, No. 12, May 1969, p. 1634.

*Primary Examiner*—William D. Larkins
*Attorney, Agent, or Firm*—Stanley Z. Cole; Gerald M. Fisher; Robert K. Stoddard

[57] ABSTRACT

An epitaxial layer of a quaternary III-V alloy of Ga, In, As, and P has its constituents proportioned for lattice matching to a substrate having a lattice constant falling within the range of 5.45 to 6.05 A. In addition, the constituents of the alloy are proportioned to provide a selected bandgap energy falling within the range of 2.23 to 0.35 electron volts; this corresponds to wavelengths of 0.55 to 3.5 microns. Near perfect lattice matched heterojunctions are provided between the epitaxial layer and the lattice matched substrate; these are useful for providing improved photocathodes and lasers, particularly in the infrared range of wavelengths between 0.8 and 2.0 microns.

9 Claims, 7 Drawing Figures

EPITAXIAL INDIUM-GALLIUM-ARSENIDE PHOSPHIDE LAYER ON LATTICE-MATCHED INDIUM-PHOSPHIDE SUBSTRATE AND DEVICES

This is a continuation of application Ser. No. 291,457 filed Sept. 22, 1972, now abandoned.

GOVERNMENT CONTRACT

The invention herein described was made in the course of or under a contract with the U.S. Army.

DESCRIPTION OF THE PRIOR ART

Heretofore, quaternary III-V alloys of AlGaAsP have been grown as lattice matched epitaxial layers upon a ternary alloy of GaAsP by increasing the ratio of Al to Ga in the epitaxial layer. The ratio of As/P was maintained constant in both the substrate and the epitaxial layer, resulting in only a bandgap energy change in the epitaxial layer relative to that of the substrate. Such a lattice matched epitaxial layer is disclosed by Burnham, R.D., N. Holonyak, Jr., and D. R. Scifres in an article appearing in the Applied Physics Letters, volume 17, page 455, published in 1970. Such a lattice matched epitaxial layer on a substrate can produce a low loss heterojunction particularly useful as a room temperature pulsed laser in the visible band of wavelengths falling within the range of 0.78 to 0.5 micron, i.e. 5,000 to 7,800 angstroms.

While lattice matched epitaxial layers having bandgap energies corresponding to wavelengths in the visible range are useful, it is desirable to extend the operating range of wavelengths into the infrared and, in particular, into certain wavelengths within the infrared, such as the wavelength of approximately 1.06 microns. This wavelength corresponds to the wavelength of a high power Nd:YAG laser which can provide average power output on the order of $10^3$ watts for pulsed operation. An atmospheric window also occurs at this wavelength. However, the prior art quaternary III-V alloy cannot operate in this wavelength range due to the fact that its bandgap energy range corresponds to the visible wavelengths and does not extend down into the infrared.

SUMMARY OF THE PRESENT INVENTION

The principal object of the present invention is the provision of lattice matched heterojunction epitaxial layers of InGaAsP and devices using same.

In one feature of the present invention, the constituents of an epitaxial layer of InGaAsP are proportioned for obtaining a lattice match to a substrate having a lattice constant falling within the range of 5.45 to 6.05 A, whereby within certain limits of the III-V alloy, independent control is obtained over the lattice constant and bandgap energy (operating wavelength) of the epitaxial layer.

In another feature of the present invention, the constituents of the quaternary III-V alloy of InGaAsP are proportioned to obtain a lattice match to a substrate of InP and to obtain a bandgap energy falling within the range of 0.7 to 1.3 electron volts, corresponding to wavelengths falling within the range of 1.7 to 1.0 microns.

In another feature of the present invention, a transparent mode photocathode employs an epitaxial layer of lattice matched InGaAsP grown upon a substrate with the bandgap of the epitaxial layer being less than the bandgap of the substrate, whereby improved efficiency is obtained, particularly in the infrared region.

In another feature of the present invention, a solid state laser includes a lattice matched epitaxial layer of InGaAsP grown upon a suitable semiconductive substrate, such as InP, to provide coherent output radiation, particularly in the infrared region.

Other features and advantages of the present invention will become apparent upon a perusal of the following specification taken in connection with the accompanying drawings wherein:

DESCRIPTION OF THE PREFERRED EMBODIMENTS

Figure 1:
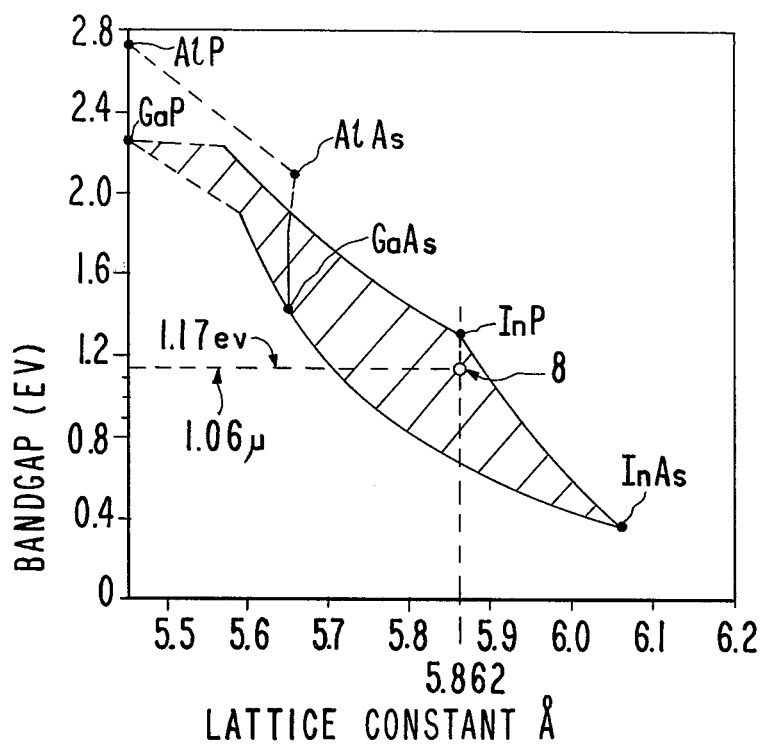
FIG. 1 is a plot of bandgap energy in electron volts vs. lattice constant in angstroms for various III-V semiconductive alloys and depicting, in the cross-hatched region thereof, the quaternary III-V alloy of GaInAsP.

Referring now to FIG. 1, there is shown the bandgap energy vs. lattice constant diagram for the quaternary III-V alloy of GaInAsP shown as the cross-hatched portion of the plot of FIG. 1 bounded by the ternary alloys of GaInP, InAsP, GaInAs and GaAsP. As can be seen from the plot of FIG. 1, this quaternary III-V alloy will provide bandgap energies between 0.35 and 2.23 electron volts with lattice constants falling within the range of 5.45 and 6.05 angstroms. However, the growth of lattice matched heterojunctions can only be accomplished by simultaneous variation of both the Ga/In and As/P ratios in the epitaxial layer as a function of the lattice constant of the substrate, as contrasted with the prior art quaternary of GaAlAsP wherein the ratio of Al to Ga can be increased while maintaining the ratio of As/P constant for a given lattice constant substrate to be matched.

Figure 2:
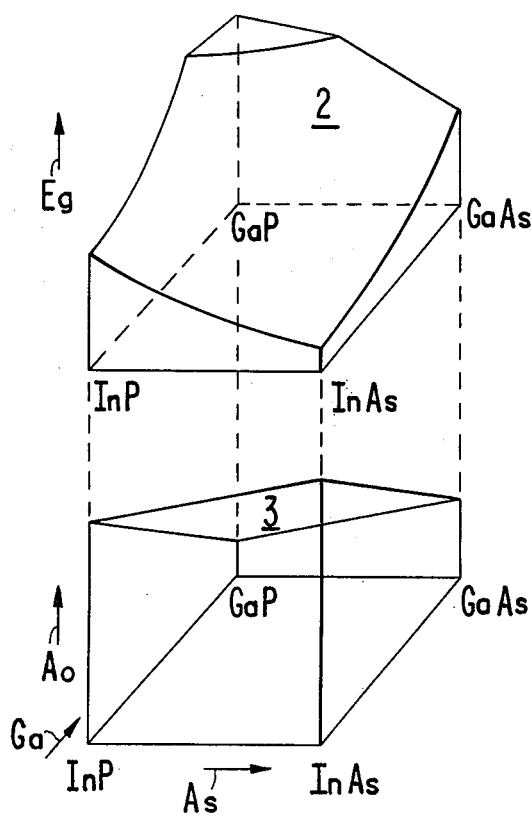
FIG. 2 is a qualitative drawing of the bandgap surface (upper figure) and lattice constant surface (bottom figure) of the InGaAsP quaternary with the compositional plane being the base of both figures.

Referring now to FIG. 2, there is shown a graphical representation of the bandgap Eg, of the InGaAsP III-V alloy system bounded by the four ternaries. The indirect bandgap region is represented schematically by a plane, while the direct region is represented by curved surface 2, and the lattice constant surface 3 is represented by a plane.

Epitaxial layers are grown, preferably by liquid phase epitaxy, on a substrate having a lattice constant within the range of 5.45 to 6.05 angstroms. The procedure used for growing the epitaxial layers consists of preparing a series of In-Ga-As solutions with increasing amounts of Ga and then saturating the solution with P. Following equilibrium, the melt is brought in contact with a single crystal substrate such as InP (111) B-oriented material, at which point a controlled cooling of 25° to 50° C, depending upon the thickness of the epitaxial layer to be grown is initiated. Cooling rates may be varied between 2.0° and 0.1° C per minute with no apparent dependence of the surface structure of the epitaxial layer on cooling rate.

The lattice constant of the epitaxial layer is measured, for example, by X-ray diffraction of Cu-Kd radiation. With relatively thin epitaxial layers and using X-ray diffraction, lattice constant of both the epitaxial layer and of the substrate can be readily ascertained. The bandgap energy of the epitaxial layer is determined by photoluminescence techniques at both room temperature and at reduced temperature, if desired. A typical device for measuring the bandgap energy is to illuminate the material with a monochromatic light source such as a 0.5 watt argon ion laser beam and observe the reflected light with a spectrophotometer, such as a Perkin Elmer 301 spectrophotometer utilizing a dry ice-cooled S-1 photomultiplier.

Figure 3:
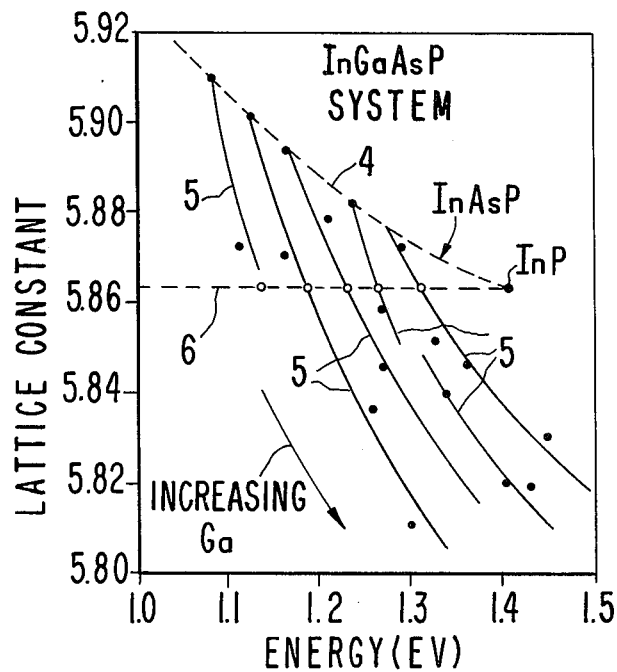
FIG. 3 is a plot of lattice constant in angstroms vs. bandgap in electron volts for several different epitaxial layers of InGaAsP for increasing amounts of Ga starting with zero Ga at the ternary boundary of InAsP.

Referring now to FIG. 3 there is shown a plot of lattice constant in angstroms vs. bandgap energy in electron volts for a number of quaternary III-V alloys of InGaAsP epitaxially grown onto a suitable substrate. More particularly, for each series of runs the initial layers were grown without gallium to establish the InAsP boundary indicated by dotted line 4. Subsequent increases in the amount of Ga resulted in growing epitaxial layers of higher bandgap and smaller lattice constant as shown by the family of curves indicated by 5.

It can be seen from this plot that a number of quaternary alloys varying in bandgap energy between 1.12 and 1.41 eV can be grown lattice matched to InP substrates as indicated by the intersection of the horizontal line 6 passing through the curves 5 and intersecting with the binary InP alloy at 7. The range of quaternary III-V alloys, in addition to those indicated in FIG. 3, can be extended throughout the entire range of lattice constants from 5.4 to 6.05 and bandgap energies from 0.35 to 2.23 eV.

Figure 4:
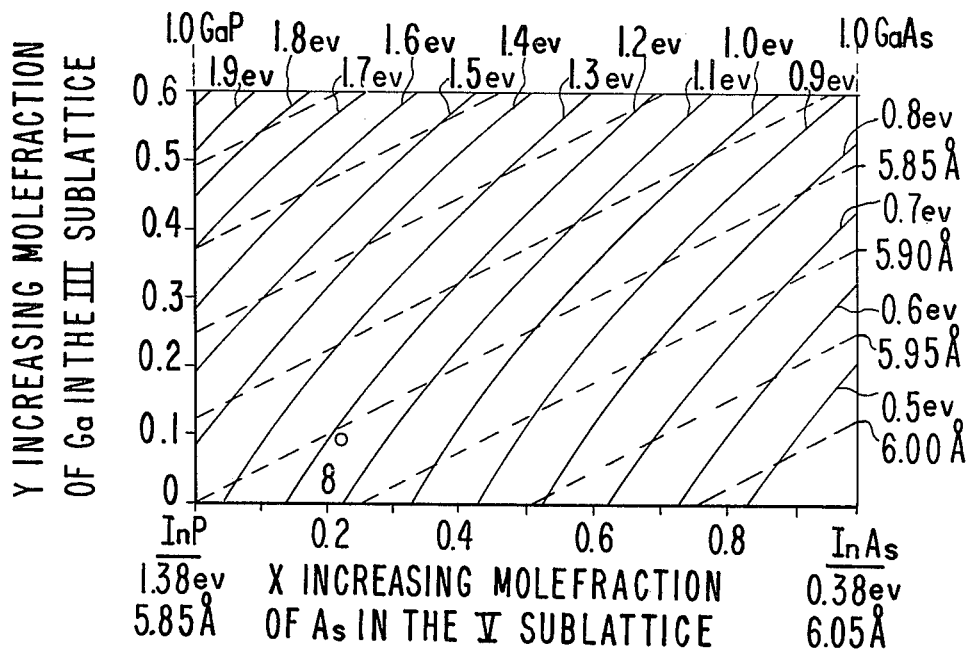
FIG. 4 is a plot of bandgap energy in electron volts and lattice constant in A as a function of composition for quaternary InGaAsP layers.

Referring now to FIG. 4 there is shown a plot of increasing molefraction of Ga in the III sub-lattice vs. increasing molefraction of As in the V sublattice. From the plot of FIG. 4 the composition for any given bandgap and lattice constant within the range plotted can be determined from the contour map of FIG. 4 showing the lattice constant and bandgap surfaces superpositioned over the compositional plane. These contours were made by making a horizontal cut into the surfaces in FIG. 2 and projecting the cut edge onto the compositional plane. The absissa represents an increase in As content in the V sublattice while the ordinant e indicates a Ga increase in the III sublattice. Composition is determined by selecting a bandgap and lattice constant and locating that point in the compositional plane.

Although the plot of FIG. 4 is limited to a relatively small section of the quaternary alloy compositional plane, respective values of bandgap and lattice constant of the plot of FIG. 4 can be readily extended to cover the entire quaternary square. More particularly, straight lines connect equal lattice constant values along the edges of the square, i.e. the square terminated on the corners by GaP, GaAs, InAs and InP, as indicated in FIG. 4.

Bandgap variations with composition are obtained by a graphical procedure where the bandgap vs. As composition is plotted for various alloys of constant Ga composition. For each constant Ga section, the end point values of the bandgap are determined from the $Ga_yIn_{1-y}P$ and $Ga_yIn_{1-y}As$ ternary data, respectively. The maximum deviation from linearity at constant Ga is determined by linear interpolation between deviations seen for the $InAs_xP_{1-x}$ and $GaAs_xP_{1-x}$ ternaries. Once the bandgap vs. As composition is determined for several different concentrations of Ga, the isobandgap lines are drawn on the compositional square.

Referring now to FIGS. 1 and 4 there is shown a particular composition of GaInAsP III-V alloy indicated by circreles 8 which corresponds to a bandgap energy of approximately 1.17 electron volts (a wavelength of 1.06 microns) and lattice constant of 5.862, which is thus lattice matched to an InP substrate. It turns out that this particular composition is especially useful because the bandgap energy of 1.17 electron volts corresponds to the laser line of Nd:YAG and to an atmospheric window. This particular combination of an epitaxial layer having a bandgap energy less than the bandgap energy of the substrate, namely the InP, is particularly useful in a photocathode 11 operated in a transparent substrate mode, as illustrated in FIG. 6.

Figure 6:
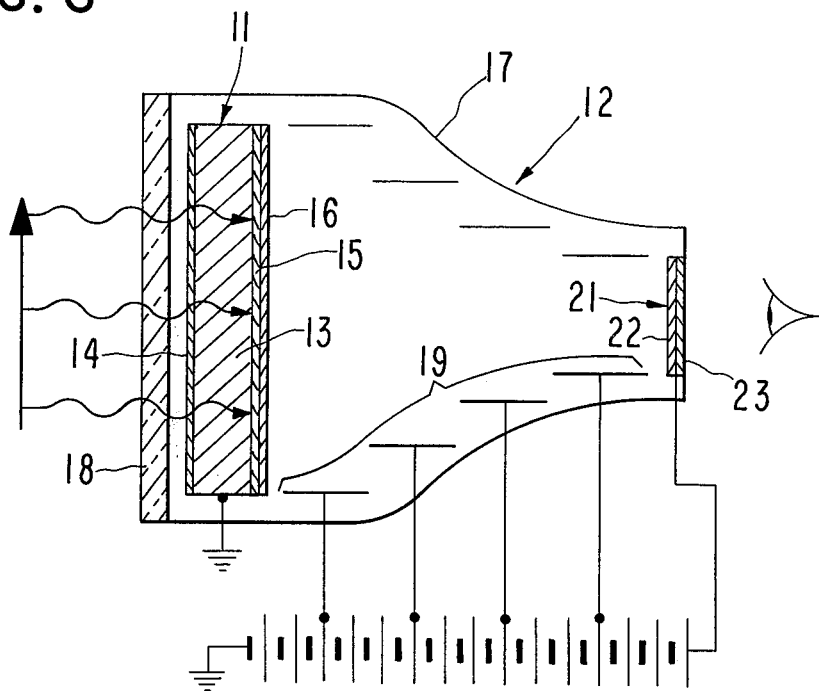
FIG. 6 is a schematic longitudinal sectional view of an image intensifier tube utilizing a photocathode of the present invention.

More particularly, photocathode 11 of FIG. 6 is utilized in an infrared image intensifier tube 12. The photocathode 11 includes an n-doped substrate 13, as of InP doped to $10^{17}$ to $10^{18}$ atoms/cm$^3$ which in a typical example is 0.020 inch to 500 microns thick. A wavelength matching layer (antireflective coating) 14, as of silicon oxide, is deposited upon the front face of the substrate 13. A lattice matched epitaxial layer 15 of the quaternary III-V alloy of InGaAsP is grown, preferably by liquid phase epitaxy, onto the rear face of the substrate 13 to a thickness, as of 4 microns. This provides a lattice matched heterojunction at the interface of layer 15 with the substrate 13. A mono layer of cesium oxide 16, which forms a low work function surface is deposited over the inside face of the epitaxial layer 15. The photocathode 11 is mounted within an evacuated envelope 17 having a radiation transparent face 18, as of infrared transparent quartz. A series of cylindrical electrostatic focusing electrodes 19 of progressively decreasing diameter is disposed within the envelope 17 between the photocathode 11 and a fluorescent screen 21 consisting of a conventional cathodeluminescent phosphor layer 22 deposited on the inside surface of an optically transparent end closing wall 23 of the envelope 17, as of glass. Ohmic contact is made to the n-doped substrate 13.

In operation, an infrared image to be intensified, such as that reflected from an object illuminated with infrared radiation of a wavelength of 1.06 microns, passes through the transparent window 18 into the evacuated image intensifier tube 12. The infrared radiation passes through the antireflective coating 14, substrate 13, and is absorbed at the heterojunction interface between the epitaxial layer 15 and the substrate 13 to generate electron-hole pairs. The electrons generated at the interface diffuse to the cesiated surface of the epitaxial layer 15 and are emitted as photocathode emission into the evacuated envelope 17. The electron image is then accelerated and focused onto the fluorescent screen 21 to produce an intensified optical image of the infrared image being observed.

Radiation of a wavelength corresponding to a bandgap energy higher than the bandgap energy of a given material is absorbed in that material, whereas energy of a wavelength corresponding to a bandgap energy less than that of the bandgap of the material will pass through the material without substantial absorption. Thus, the bandgap of the epitaxial layer 15 is chosen to be below the bandgap energy of the substrate 13. In this manner, that band of radiation corresponding to wavelengths falling between the bandgap of the substrate and that of the epitaxial layer 15 will pass through the substrate and be absorbed in the layer.

Layer 15 preferably has a thickness corresponding to the diffusion length of electrons in the layer. In addition, epitaxial layer 15 should preferably have a perfect lattice match to the substrate to eliminate defects at the interface of the epitaxial layer (heterojunction) with the substrate. Such defects could otherwise serve as capture centers for capturing the electrons and, thus, reducing the conversion efficiency of the photocathode 11.

Figure 5:
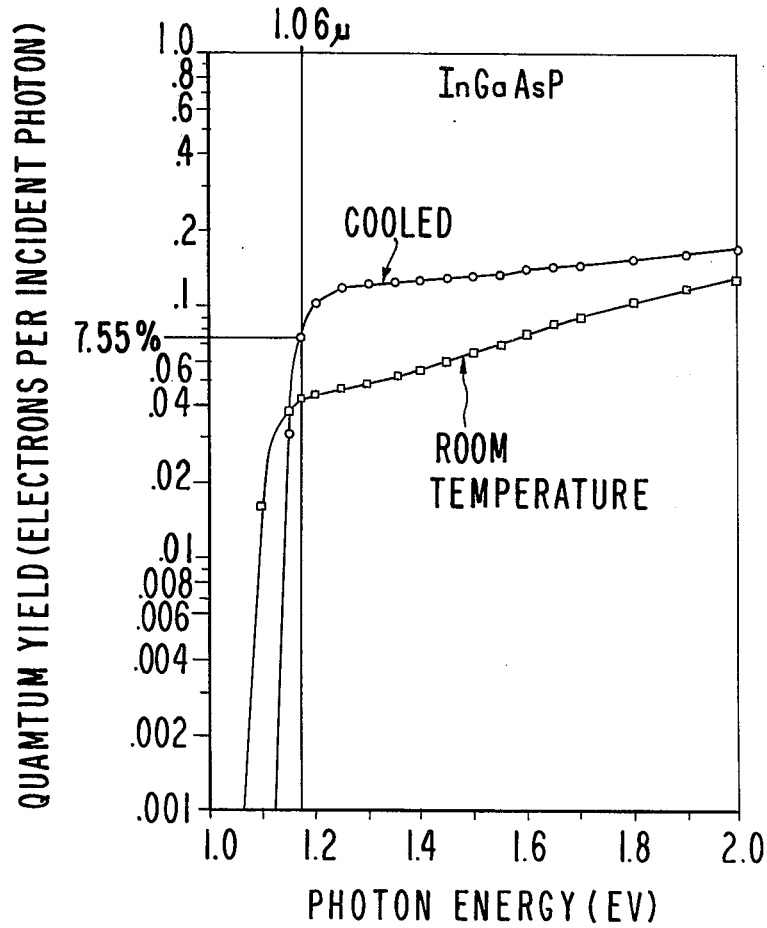
FIG. 5 is a plot of quantum yield in electrons per incident photon vs. photon energy in electron volts for an InGaAsP photocathode showing the curve for room temperature operation and minus 90° C operation.

A photocathode 11 employing an epitaxial layer 15 of GaInAsP, lattice matched to an InP substrate 13 and having a bandgap energy of 1.17 electron volts (corresponding to a wavelength of 1.06 microns,) provided an electron quantum yield of 7.55 percent when illuminated with 1.06 micron radiation from the cesiated surface and cooled to −90° C, as shown in FIG. 5. This corresponds to the highest known value of quantum yield from any photocathode at this wavelength. The highest quantum yield heretofore obtainable was attained by a ternary alloy of InAsP on InP which yielded 5.5 percent quantum efficiency when operated in a front surface geometry indicating the superior quality of the InGaAsP photocathode.

In a typical example, the epitaxial layer 15 is grown by liquid phase epitaxy onto the (111) B face of an InP single crystal material. The melt is prepared by dissolving less than 10 percent of As in In at 650° C. Ga is then added to the solution. In a typical melt for obtaining the lattice matched epitaxial layer having a lattice constant of 5.862 and a bandgap of 1.17 eV, 0.0047 gram of Ga was added to a solution of As in In produced by melting together 5.20 grams of In and 0.120 grams of InAs. The solution at 650° C was then saturated with InP by contacting the melt with InP and leaving the InP in contact with the melt for 2 hours to obtain equilibrium. Weighing the charge of InP before and after contact with the melt determines the amount of InP that is dissolved. The mole ratio of the dissolved InP gives the actual weight of P employed to saturate the melt.

After the melt is saturated with P, the melt is contacted with the (111) B oriented face (P exposed) of a single InP crystal for approximately one-half hour at 650° C. Then a cooling cycle is started which reduces the temperature of 625° C or 600° C depending upon the desired thickness of the epitaxial layer 15. In the case of a 4 micron thick layer, the cooling cycle is terminated at 625° C and the melt is removed from contact with the InP crystal.

The crystal substrate and melt are contacted in a purified hydrogen atmosphere of approximately 1 atmosphere to avoid undesired contamination of the epitaxial layer. The lattice matched epitaxial layer 15 for the above bandgap and lattice constant has a composition (not fraction ratio) as follows: $In_{0.88}Ga_{0.12}As_{0.23}P_{0.77}$.

Although the epitaxial layer 15 was grown upon the (111) B face with the P atoms exposed this is not a requirement as the epitaxial layer may be grown upon the (111) A face with the group III element exposed or upon the (100) face.

Figure 7:
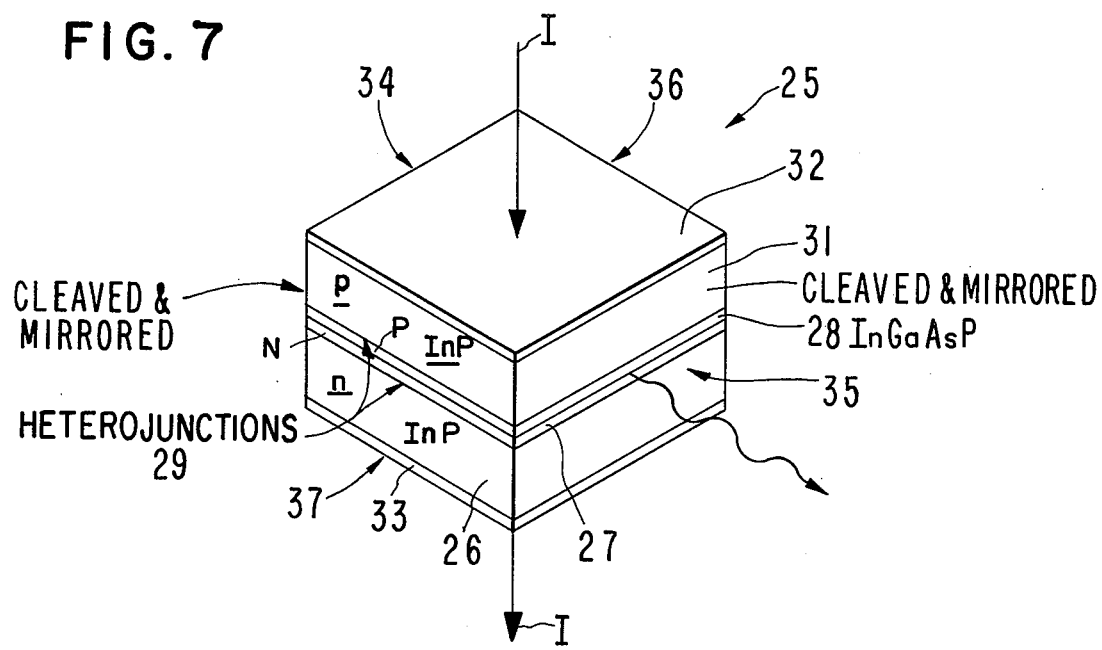
FIG. 7 is a schematic perspective view of a solid state laser incorporating features of the present invention.

Referring now to FIG. 7 there is shown a double heterojunction laser 25 incorporating features of the present invention. More particularly, the solid state heterojunction laser 25 includes an InP substrate 26, as of 200 microns thick, doped with a typical n-type dopant such as Te to $10^{18}$ atoms per cubic centimeter. An n-type epitaxial layer 27 of InGaAsP, as of 5 microns in thickness, is grown upon the InP substrate 26 and doped with an n-type dopant such as Sn, Te, Se to a concentration of, for example, $3 \times 10^{18}$ atoms per cubic centimeter. N-doped quaternary layer 27 is lattice matched with InP substrate 26. A p-doped epitaxial layer 28 of the quaternary alloy InGaAsP of a composition to be lattice matched with the epitaxial substrate 26 and then n-doped quaternary layer 27 is grown upon the epitaxial layer 27 to a thickness, as of 1 to 2 microns to form a lattice matched heterojunction 29 with the n-doped quaternary layer 26. A fourth layer 31 of p-doped InP is epitaxially grown over the quaternary layer 28 as the other side of the double heterojunction structure.

Ohmic contacts 32 and 33 are deposited on opposite sides of the semiconductive sandwich for passage of electrical current through the device. The crystal is cleaved and mirrored on opposite sides 34 and 35 with the mirror on side 35 having a reflectivity less than 100 percent at the operating wavelength to form the output mirror of the laser cavity. The remaining two sides 36 and 37 are optically diffused such that the coherent radiation is retained within the lasing region of InP adjacent the P-type region of InGaAsP. Heterojunction lasers are disclosed in an article titled "The Family of Lasers: A Survey" appearing in IEEE Spectrum, volume 9, number 3, (March 1972) pages 26–47, see particularly page 38.

The advantage of the laser 25 of FIG. 7 and other types of lasers utilizing a lattice matched heterojunction of the quaternary III-V alloy of InGaAsP is that the quaternary compound allows independent variation of the bandgap and lattice constants, whereby a lattice constant match to the substrate can be obtained for the heterojunction of a given bandgap, thereby substantially increasing the efficiency of operation and permitting room temperature operation. Independent variation of the bandgap energy allows a substantial range of operating wavelengths, including the infrared range, for the laser 25.

As used herein, "lattice matched" means lattice matched to within 0.5 percent. "Substrate" means substrate member and layers formed thereon and "quaternary III-V alloy of InGaAsP" means that the elements are proportioned according to the formula: $In_x Ga_{1-x} As_y P_{1-y}$ or the equivalent mol fraction formula $In_{.5x}Ga_{.5-x}As_{.5y}P_{.5-.5y}$.

What is claimed is:

1. A lattice-matched heterojunction device comprising:
    a substrate comprising a binary III-V compound of the elements indium and phosphorus and having a lattice constant falling within the range of 5.45 to 6.05 angstroms;
    an epitaxial quaternary III-V layer of the compound InGaAsP joined to the surface of said substrate to form a heterojunction with said substrate, said epitaxial layer having a lattice constant matched to within 0.5 percent of the lattice constant of said substrate to form a lattice matched heterojunction between said substrate and said epitaxial layer.

2. The device of claim 1 wherein said heterojunction device is a photocathode which includes a low work function coating overlaying said epitaxial layer of InGaAsP, and an ohmic contact is provided to said substrate for applying an operating potential to said photocathode.

3. The device of claim 2 wherein said low work function coating is $Cs_2O$.

4. The device of claim 2 wherein the bandgap energy of said epitaxial layer is less than the bandgap energy of said substrate.

5. The device of claim 1 wherein the heterojunction device is a solid state laser including means for applying a flow of electrical current to said heterojunction to produce stimulated coherent emission of radiation.

6. The device of claim 5 further including an epitaxial layer of semiconductive material overlaying and interfacing with said epitaxial layer of InGaAsP, said overlaying epitaxial layer having a lattice constant matched to that of said epitaxial layer of InGaAsP.

7. The device of claim 6 further including a pair of planar generally parallel cleaved and mirrored surfaces spaced apart to define a radiation cavity resonator.

8. The device of claim 6 wherein the bandgap of said quanternary layer is lower than the bandgap of said lattice matched substrate and said lattice matched overlaying layer.

9. The device of claim 1 wherein said epitaxial layer is $In_{0.88}Ga_{0.12}As_{0.23}P_{0.77}$.

* * * * *

U NITED STATES PATENT AND TRADEMARK OFFICE
CERTIFICATE OF CORRECTION

PATENT NO. : 3,982,261
DATED : September 21, 1976
INVENTOR(S) : George A. Antypas It is certified that error appears in the above-identified patent and that said Letters Patent are hereby corrected as shown below:

In the Abstract,
line 6 "falling within the range" should be deleted.

In column 2, line 59 "Eg" should be -- $E_g$ -- ;
In column 3, line 12 "Cu-Kd" should be -- $Cu-K_\alpha$ --; line 56 "ordinant e" should be -- ordinate -- ;
In column 4, line 15, "circreles" should be -- circles -- ;
In column 5, line 67 "not" should be -- mol -- ;
In column 6, line 41 "of" first occurrence should be -- to --; and in line 66 "angstrons" should be -- angstroms --.

Signed and Sealed this

[SEAL]

Nineteenth Day of June 1979

Attest:

RUTH C. MASON
Attesting Officer

DONALD W. BANNER
Commissioner of Patents and Trademarks

REEXAMINATION CERTIFICATE (665th)

United States Patent [19]

Antypas

[11] B1 3,982,261

[45] Certificate Issued Apr. 7, 1987

[54] EPITAXIAL INDIUM-GALLIUM-ARSENIDE PHOSPHIDE LAYER ON LATTICE-MATCHED INDIUM-PHOSPHIDE SUBSTRATE AND DEVICES

[75] Inventor: George A. Antypas, Palo Alto, Calif.

[73] Assignee: Varian Associates, Palo Alto, Calif.

Reexamination Request:
No. 90/000,424, Jul. 25, 1983

Reexamination Certificate for:
Patent No.: 3,982,261
Issued: Sep. 21, 1976
Appl. No.: 496,487
Filed: Aug. 12, 1974

Certificate of Correction issued Jun. 19, 1979.

Related U.S. Application Data

[63] Continuation of Ser. No. 291,457, Sep. 22, 1972, abandoned.

[44] Published under the second Trial Voluntary Protest Program on January 20, 1976 as document No. B 496,487.

[51] Int. Cl.$^4$ .................. H01L 29/205; H01L 31/00; H01S 31/19

[52] U.S. Cl. ...................................... 357/16; 148/171; 148/172; 148/175; 148/DIG. 65; 148/DIG. 72; 148/DIG. 97; 148/DIG. 120; 313/373; 313/529; 357/30; 357/61; 372/44

[58] Field of Search .................................. 357/16, 61

[56] References Cited

U.S. PATENT DOCUMENTS

| | | | |
|---|---|---|---|
| 3,218,205 | 11/1965 | Ruehrwein | 148/175 |
| 3,309,553 | 3/1967 | Kroemer | 313/108 |
| 3,415,989 | 12/1968 | Leventhal et al. | 357/16 |
| 3,447,976 | 6/1969 | Faust et al. | 148/1.5 |
| 3,560,275 | 2/1971 | Kressell et al. | 148/171 |
| 3,614,549 | 10/1971 | Lorenz et al. | 357/17 |
| 3,644,770 | 2/1972 | Bell | 313/94 |
| 3,672,992 | 6/1972 | Schaefer | 117/219 |
| 3,691,476 | 9/1972 | Hayashi | 331/94.5 |
| 3,694,759 | 9/1972 | Kasano et al. | 330/4.9 |
| 3,801,509 | 4/1974 | Kurata et al. | 357/61 |
| 3,814,996 | 6/1974 | Enstrom et al. | 357/3 D |

FOREIGN PATENT DOCUMENTS

1278349  6/1972  United Kingdom.

OTHER PUBLICATIONS de Cremoux et al, Institute of Physics (U.K.) Conf. Series No. 56, chapter 2, 1981.

Onabe, Japan, J. Appl. Phys., vol. 21, No. 5, pp. 797–798 (1982).

Takahei et al, Japan, J. Appl. Physics, vol. 20, No. 4, Apr. 1981, pp. Letters 313–316.

Oe, Appl. Phys. Letters vol. 33, No. 11, 1 Dec. 1978, pp. 962–964.

Nakajimi et al, J. Appl. Phys., vol 52, No. 7, Jul. 1981, pp. 4575–4582.

Shih et al, IBM Tech. Disclosure Bulletin, vol. 11, No. 12, May 1969, p. 1634.

H. Kroemer, "A Proposed Class of Heterojunction Injector Lasers", Proceedings of the IEEE, 51, 1782–1783, (1963).

R. K. Willardson & A. C. Beer, *Semiconductors and Semimetals*, vol. 1, Chp. 5, "Energy Band Structures of Mixed Crystals of III–V Compounds", pp. 143–145 (Academic Press, N.Y., 1966).

A. Onton, "Optical Properties and Band Structure of III–V Compounds and Alloys", Abstracts of Symposium on the Physics and Technology of Semiconductor Light Emitters and Detectors, Sep. 4–10, 1972.

N. N. Sirota and V. I. Osinskii, "Radiation of p–n Junctions on Crystals of Solid Solutions of InP and GaAs", Soviet Physics–Doklady, v. 11, pp. 950–952 (1967).

R. M. Potemski and J. M. Woodall, "A New Technique for Terminating Liquid Phase Epitaxial Growth", J. Electrochem. Soc; Solid–State Science and Technology, Feb. 1972, 277.

Joseph M. Blum, "The Liquid Phase Epitaxy of $Al_x Ga_{1-x}$ as for Monolithic Planar Structures", Proceedings of the IEEE, v. 59, p. 1498 (1971).

H. F. Lockwood and M. Ettenberg, "Thin Solution Multiple Layer Epitaxy", J. Crystal Growth, v. 15, 81 (Jun. 1972).

N. N. Sirota and I. V. Bodnar, "Dependance of the Forbidden-Band Width on the Composition of the Quasibinary In-As-GaP System", Soviet Physics—Semiconductors, v. 5, 516 (1971).

R. C. Clarke, et al, "The Preparation of High Purity Expitaxial InP", Solid State Communications, v. 8, p. 1125 (1970).

R. D. Burnham, et al, "$Al_x Ga_{1-x} As_{1-y} P_y$—$GaAs_{1-y} P_y$ Heterostructure Laser and Lamp Junctions", App. Phys. Letts., v. 17, p. 455 (1970).

M. B. Panish, et al, "III–V Crystalline Solid Solution Systems", Proceedings, 1970 Symp. on GaAs, Paper 7, 67.

B. I. Miller, et al, "Reproducible Liquid–Phase-Epitaxial Growth of Double Heterostructure GaAs—$Al_x Ga_{1-x}$ As Laser Diodes", J. App. Phys., v. 43, (Jun. 1972), pp. 2817–2826.

(List continued on next page.)

*Primary Examiner*—William D. Larkins

[57] ABSTRACT

An epitaxial layer of a quaternary III–V alloy of Ga, In, As, and P has its constituents proportioned for lattice matching to a substrate having a lattice constant falling within the range of 5.45 to 6.05 A. In addition, the constituents of the alloy are proportioned to provide a selected bandgap energy falling within the range of 2.23 to 0.35 electron volts; this corresponds to wavelengths of 0.55 to 3.5 microns. Near perfect lattice matched heterojunctions are provided between the epitaxial layer and the lattice matched substrate; these are useful for providing improved photocathodes and lasers, particularly in the infrared range of wavelengths between 0.8 and 2.0 microns.

OTHER PUBLICATIONS
(see Top Sheet)

M. Ettenberg and R. J. Paff, "Thermal Expansion of AlAs", J. App. Phys., v. 41, 3926 (1970).

K. Sugiyama and H. Saito, "GaAsSb–AlGaAsSb" Double Heterojunction Lasers", Jap. J. App. Phys., v. 11, 1057 (1972).

Zh. I. Alferov, et al, "Heterojunctions on the Base of a $A^{III}B^{V}$ Semiconducting and of Their Solid Solutions", Proceedings of International Conference on the Physics and Chemistry of Semiconductor Heterojunctions and Layer Structures, v. 1, 93 (1971).

Müller et al., "Miscibility of III–V Semiconductors Studied by Flash Evaporation", Journal of Applied Physics 35, 1233–1241 (1964).

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINTED THAT:

Claims 1-9 are cancelled.

* * * * *